US012562222B2

(12) United States Patent
Jiang et al.

(10) Patent No.: US 12,562,222 B2
(45) Date of Patent: **\*Feb. 24, 2026**

(54) REFERENCE VOLTAGE ADJUSTMENT FOR WORD LINE GROUPS

(71) Applicant: Micron Technology, Inc., Boise, ID (US)

(72) Inventors: Tao Jiang, Shanghai (CN); Bo Zhou, Shanghai (CN); Guang Hu, Mountain View, CA (US)

(73) Assignee: Micron Technology, Inc., Boise, ID (US)

( \* ) Notice: Subject to any disclaimer, the term of this patent is extended or adjusted under 35 U.S.C. 154(b) by 107 days.

This patent is subject to a terminal disclaimer.

(21) Appl. No.: 18/421,729

(22) Filed: Jan. 24, 2024

(65) Prior Publication Data

US 2024/0242760 A1     Jul. 18, 2024

Related U.S. Application Data

(63) Continuation of application No. 17/649,885, filed on Feb. 3, 2022, now Pat. No. 11,900,992.

(51) Int. Cl.
G11C 11/4099     (2006.01)
G11C 11/4074     (2006.01)
(Continued)

(52) U.S. Cl.
CPC ...... G11C 11/4099 (2013.01); G11C 11/4074 (2013.01); G11C 11/4076 (2013.01); G11C 11/4085 (2013.01); G11C 11/4096 (2013.01)

(58) Field of Classification Search
CPC ............ G11C 11/4099; G11C 11/4074; G11C 11/4076; G11C 11/4085; G11C 11/4096;
(Continued)

(56) References Cited

U.S. PATENT DOCUMENTS 11,158,387 B1     10/2021   He et al.
11,900,992 B2 \*   2/2024   Jiang ................... G11C 11/5642
(Continued)

FOREIGN PATENT DOCUMENTS

CN          113903377 A       1/2022

OTHER PUBLICATIONS

Chinese patent office, "CN Notice of Allowance, including Search Report," issued in connection with China Patent Application No. 202310048876.2 dated Feb. 17, 2025 (12 pages total; 6 pages original & 6 pages machine translation).

*Primary Examiner* — Fernando Hidalgo
(74) *Attorney, Agent, or Firm* — Holland & Hart LLP

(57) ABSTRACT

Methods, systems, and devices for reference voltage adjustment for word line groups are described. In some examples, one or more components of a memory system may determine a duration that data has been stored to one or more memory cells. Based on the duration, a voltage value of one or more reference voltages may be adjusted accordingly. For example, a voltage value of one or more reference voltages may be adjusted based on the duration. Moreover, the reference voltage values may be adjusted differently in response to the memory cells having stored data for a relatively longer duration, as opposed to memory cells that have stored data for a relatively shorter duration. The adjusted reference voltages may be used during a subsequent read operation. The voltage value of the one or more reference voltages may be adjusted on a word-line group by word-line group basis.

20 Claims, 7 Drawing Sheets

(51) Int. Cl.
    *G11C 11/4076*        (2006.01)
    *G11C 11/408*         (2006.01)
    *G11C 11/4096*       (2006.01)

(58) Field of Classification Search
    CPC ..... G11C 11/5642; G11C 16/26; G11C 16/32;
                            G11C 16/349; G11C 8/18; G11C
              16/0483; G11C 2207/2254; G11C 8/08;
                                     G11C 16/08
    USPC ....................................................... 365/185.2
    See application file for complete search history.

(56)                         References Cited

U.S. PATENT DOCUMENTS

| | | |
|---|---|---|
| 2007/0159888 A1 | 7/2007 | Tu et al. |
| 2010/0165720 A1 | 7/2010 | Lin et al. |
| 2015/0309737 A1* | 10/2015 | Kim ......................... G11C 8/08 |
| | | 711/103 |
| 2022/0020448 A1 | 1/2022 | Bedeschi et al. |
| 2023/0043877 A1* | 2/2023 | Xu ..................... G11C 13/0035 |

\* cited by examiner

|  | Valley | Bin 1 | Bin 2 | Bin 3 | Bin 4 | Bin 5 | Bin 6 | Bin 7 |
|---|---|---|---|---|---|---|---|---|
| | | 410-a | 410-b | 410-c | 410-d | 410-e | 410-f | 410-g |
| 405-a | 1 | -20mV | -40mV | -60mV | -80mV | -90mV | -100mV | -110mV |
| 405-b | 2 | -20mV | -40mV | -60mV | -80mV | -90mV | -110mV | -120mV |
| 405-c | 3 | -40mV | -80mV | -120mV | -160mV | -170mV | -190mV | -210mV |
| 405-d | 4 | -40mV | -80mV | -120mV | -160mV | -180mV | -220mV | -260mV |
| 405-e | 5 | -50mV | -100mV | -150mV | -200mV | -220mV | -260mV | -310mV |
| 405-f | 6 | -60mV | -120mV | -180mV | -240mV | -270mV | -330mV | -400mV |
| 405-g | 7 | -70mV | -140mV | -210mV | -280mV | -340mV | -420mV | -510mV |

FIG. 4A 400-a

|  | Duration | WGR0 | WGR1 | WGR2 | WGR3 | WGR4 | WGR5 | WGR6 | WGR7 |
|---|---|---|---|---|---|---|---|---|---|
| | | 420-a | 420-b | 420-c | 420-d | 420-e | 420-f | 420-g | 420-h |
| 415-a | 1 | 20mV | 10mV | 0mV | 10mV | 20mV | 20mV | 40mV | 60mV |
| 415-b | 2 | 30mV | 5mV | 0mV | 10mV | 20mV | 20mV | 45mV | 60mV |
| 415-c | 3 | 20mV | 5mV | 0mV | 10mV | 30mV | 30mV | 40mV | 70mV |
| 415-d | 4 | 20mV | 10mV | 0mV | 10mV | 25mV | 20mV | 40mV | 70mV |
| 415-e | 5 | 20mV | 0mV | 0mV | 10mV | 30mV | 30mV | 40mV | 70mV |
| 415-f | 6 | 20mV | 0mV | 0mV | 10mV | 30mV | 20mV | 40mV | 70mV |
| 415-g | 7 | 20mV | 0mV | 0mV | 10mV | 30mV | 20mV | 40mV | 70mV |
| 415-h | 8 | 20mV | 0mV | 0mV | 10mV | 40mV | 30mV | 50mV | 80mV |
| 415-i | 9 | 15mV | 0mV | 0mV | 20mV | 40mV | 30mV | 50mV | 80mV |
| 415-j | 10 | 10mV | 5mV | 0mV | 10mV | 30mV | 30mV | 50mV | 80mV |
| 415-k | 11 | 15mV | 0mV | 0mV | 20mV | 40mV | 25mV | 40mV | 90mV |
| 415-l | 12 | 10mV | 0mV | 0mV | 20mV | 40mV | 30mV | 50mV | 90mV |
| 415-m | 13 | 15mV | 5mV | 0mV | 25mV | 35mV | 30mV | 50mV | 85mV |
| 415-n | 14 | 20mV | 10mV | 0mV | 30mV | 40mV | 25mV | 50mV | 80mV |

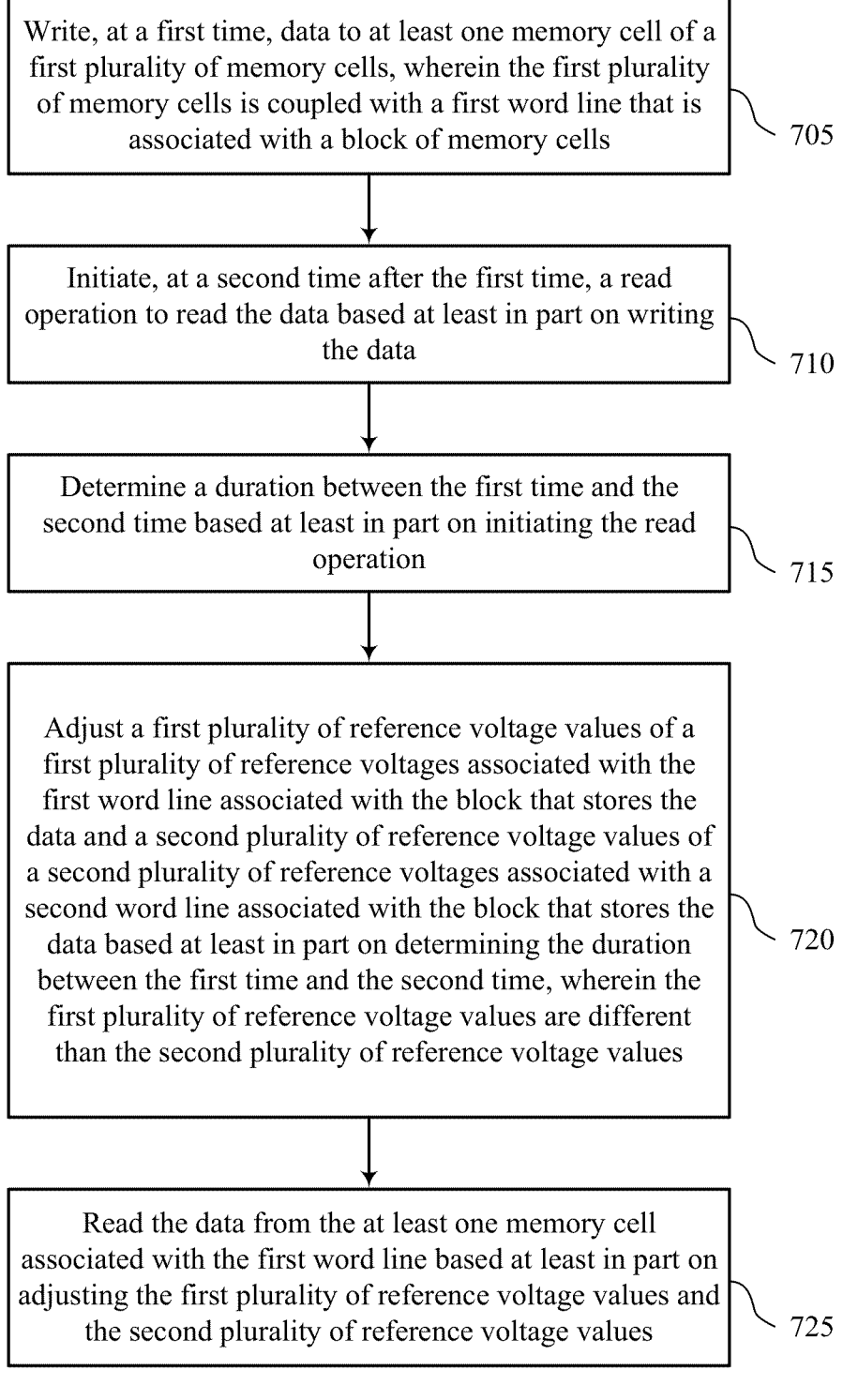

Write, at a first time, data to at least one memory cell of a first plurality of memory cells, wherein the first plurality of memory cells is coupled with a first word line that is associated with a block of memory cells

705

Initiate, at a second time after the first time, a read operation to read the data based at least in part on writing the data

710

Determine a duration between the first time and the second time based at least in part on initiating the read operation

715

Adjust a first plurality of reference voltage values of a first plurality of reference voltages associated with the first word line associated with the block that stores the data and a second plurality of reference voltage values of a second plurality of reference voltages associated with a second word line associated with the block that stores the data based at least in part on determining the duration between the first time and the second time, wherein the first plurality of reference voltage values are different than the second plurality of reference voltage values

720

Read the data from the at least one memory cell associated with the first word line based at least in part on adjusting the first plurality of reference voltage values and the second plurality of reference voltage values

REFERENCE VOLTAGE ADJUSTMENT FOR WORD LINE GROUPS

CROSS REFERENCE

The present application for patent is a continuation of U.S. patent application Ser. No. 17/649,885 by Jiang et al., entitled "REFERENCE VOLTAGE ADJUSTMENT FOR WORD LINE GROUPS," filed Feb. 3, 2022, assigned to the assignee hereof, and is expressly incorporated by reference in its entirety herein.

FIELD OF TECHNOLOGY

The following relates generally to one or more systems for memory and more specifically to reference voltage adjustment for word line groups.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

BRIEF DESCRIPTION OF THE DRAWINGS

FIGS. 4A and 4B illustrate block diagrams that support reference voltage adjustment for word line groups in accordance with examples as disclosed herein.

FIG. 7 shows a flowchart illustrating a method or methods that support reference voltage adjustment for word line groups in accordance with examples as disclosed herein.

DETAILED DESCRIPTION

Some memory devices, such as non-volatile memory devices (e.g., memory systems that include non-volatile memory cells, such as NAND memory cells), may include one or more blocks (e.g., one or more blocks of memory cells). In some examples, a block may include a set of one or more word lines that may each be coupled with one or more memory cells. In some examples, the memory cells may be configured to store one or more bits of data, and a reference voltage (or a set of reference voltages) may be used to determine a value (e.g., a logic value) stored to the respective memory cells. However, as a memory device ages, a memory cell's ability to maintain a charge may degrade. Thus some memory devices may utilize a block family error avoidance (BFEA) scheme to adjust the reference voltages for a block in order to mitigate any errors that may arise due to the cells' ability to maintain respective charges over durations of time. However, such schemes are performed on a block-by-block basis and may not provide adequate granularity for error avoidance. Accordingly, a system capable of performing BFEA on groups of word lines may be beneficial.

A system capable of performing BFEA on groups of word lines is described herein. In some examples, a memory system may be configured to determine a duration that data has been stored to a respective memory cell (or a set of memory cells) and may adjust a set of reference voltage values associated with the respective memory cell (or the set of memory cells) based on the age of the data. For example, the memory system may include a plurality of word line groups (WGRs) that each includes a set of word lines. Each set of word lines may be coupled with a set of memory cells. Based on the age of the data stored to one or more memory cells of a WGR, a voltage value of one or more reference voltages for the WGR may be adjusted to compensate for the cells' ability to maintain respective charges over time. In some examples, a first adjustment to the voltage levels of one or more reference voltages may be determined for an entire block and a second adjustment to the voltage levels of one or more reference voltages may be determined for individual WGRs in the group. The resulting voltage level of a reference voltage may be based on both the first adjustment and the second adjustment. Accordingly, by utilizing a BFEA scheme on a WGR basis may improve the system's ability to accurately sense sets of memory cells that have stored data for a relatively long duration.

Figure 1:
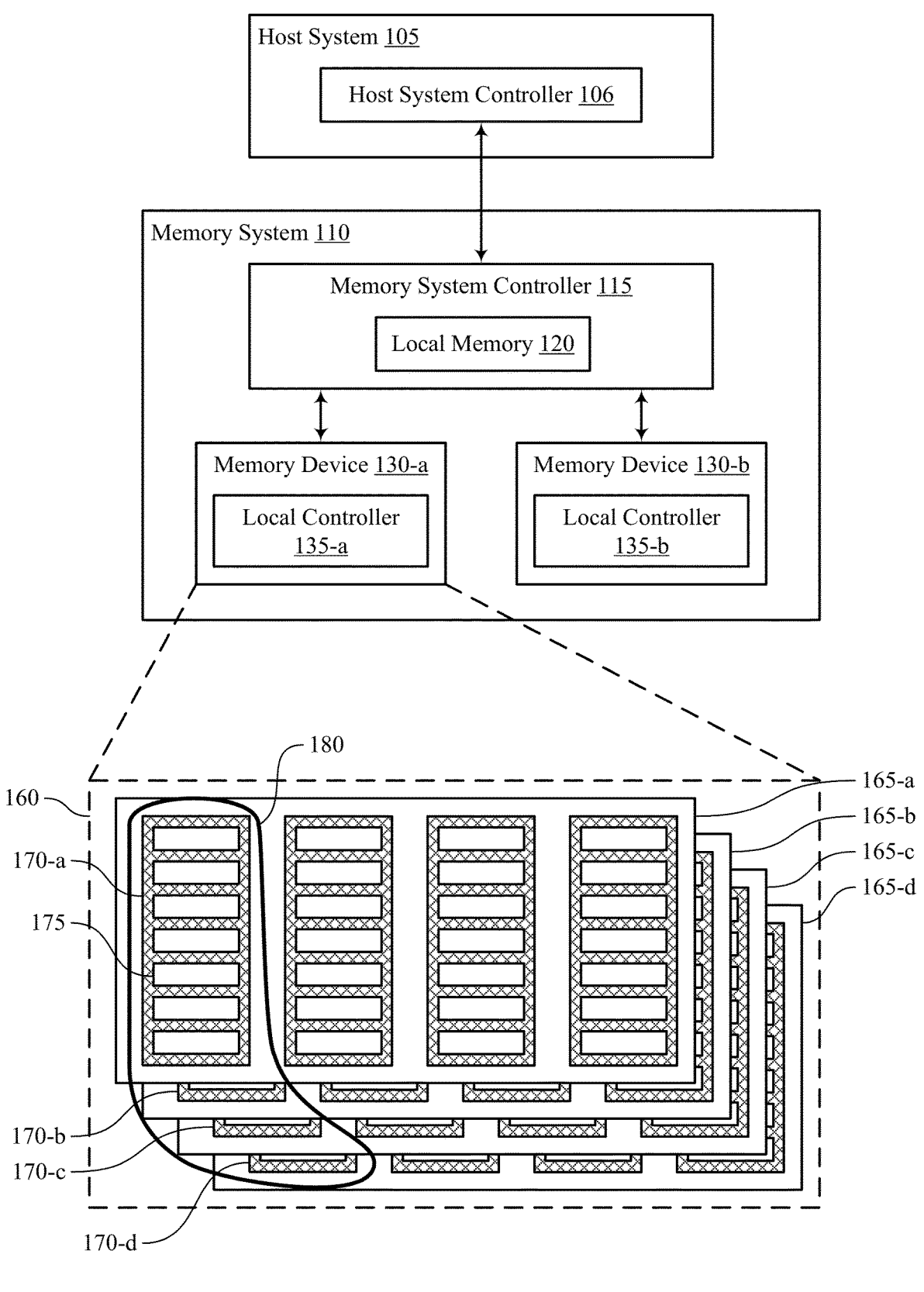
FIG. 1 illustrates an example of a system that supports reference voltage adjustment for word line groups in accordance with examples as disclosed herein.
Figure 2:
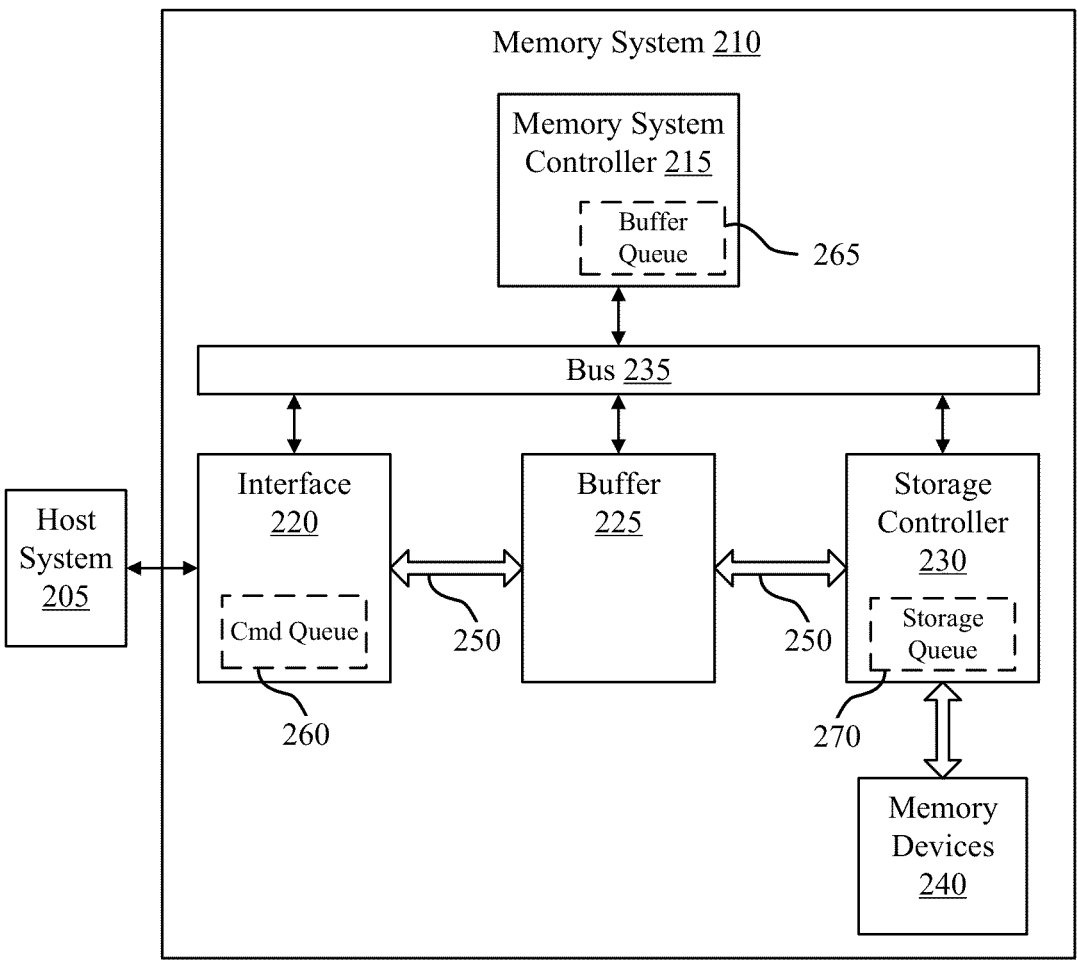
FIG. 2 illustrates an example of a system that supports reference voltage adjustment for word line groups in accordance with examples as disclosed herein.

Features of the disclosure are initially described in the context of systems, devices, and circuits with reference to FIGS. 1 and 2. Features of the disclosure are described in the context of circuits, block diagrams, and a process flow diagram with reference to FIGS. 3 through 5. These and other features of the disclosure are further illustrated by and described in the context of an apparatus diagram and flowchart that relate to reference voltage adjustment for word line groups with reference to FIGS. 6 and 7.

FIG. 1 illustrates an example of a system 100 that supports reference voltage adjustment for word line groups in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random-access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random-access memory (RAM) (FeRAM), magneto RAM (MRAM), NOR (e.g., NOR flash) memory, Spin Transfer Torque (STT)-MRAM, conductive bridging RAM (CBRAM), resistive random-access memory (RRAM), oxide-based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device

130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support reference voltage adjustment for word line groups. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, the memory system controller 115 may adjust one or more reference voltages (or sets of reference voltages) associated with a memory device 130. For example, the memory devices 130 may be arranged (e.g., physically arranged) into groups of word lines (e.g., WGRs), and a set of reference voltages may be used to determine logic states stored to any one WGR. The memory system controller 115 may, in some instances, determine a duration that data has been stored to one or more memory cells associated with a WGR and may adjust a voltage value of one or more reference voltages based on the duration. Accordingly, when the data is read from the memory cell(s) of the WGR (e.g., from the memory device 130), the adjusted reference voltage values may be used to determine a logic value stored to the respective memory cell(s). Adjusting the reference voltage values on a WGR basis may improve the memory system's 110 ability to accurately sense sets of memory cells that have stored data for a relatively long duration.

FIG. 2 illustrates an example of a system 200 that supports reference voltage adjustment for word line groups in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some examples, the memory system controller 215 may adjust one or more reference voltages (or sets of reference voltages) associated with a memory device 240. For example, the memory devices 130 may be arranged (e.g., physically arranged) into groups of word lines (e.g., WGRs), and a set of reference voltages may be used to determine logic states stored to any one WGR. The memory system controller 215 may, in some instances, determine a duration that data has been stored to one or more memory cells associated with a WGR and may adjust a voltage value of one or more reference voltages based on the duration. Accordingly, when the data is read from the memory cell(s) of the WGR (e.g., from a memory device 240), the adjusted reference voltage values may be used to determine a logic value stored to the respective memory cell(s). Adjusting the reference voltage values on a WGR basis may improve the memory system's 210 ability to accurately sense sets of memory cells that have stored data for a relatively long duration.

Figure 3:
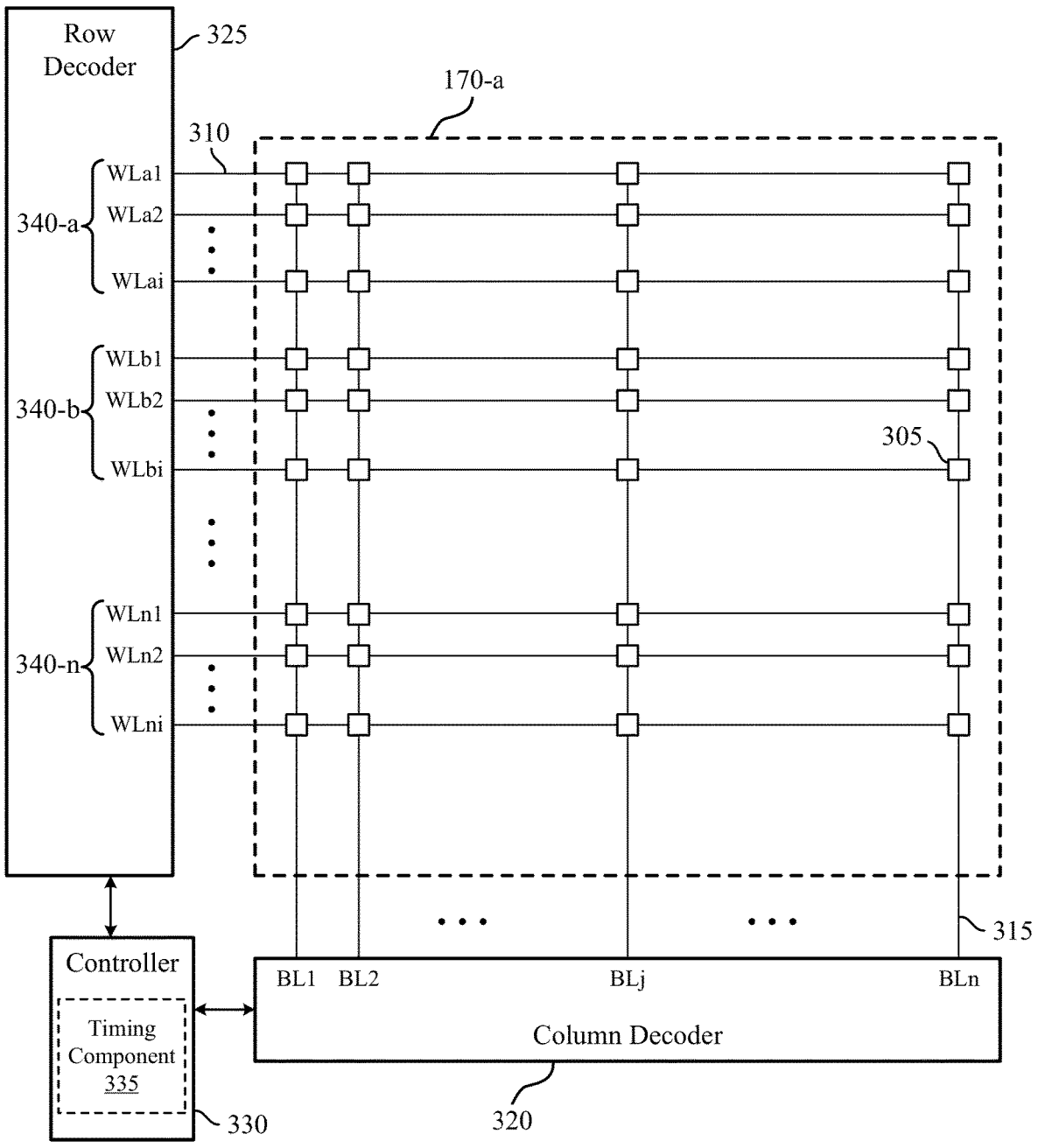
FIG. 3 illustrates an example of a circuit that supports reference voltage adjustment for word line groups in accordance with examples as disclosed herein.

FIG. 3 illustrates an example of a circuit 300 that supports reference voltage adjustment for word line groups in accordance with examples as disclosed herein. The circuit 300 may be included in a memory system 110 and may include one or more components of a memory device 130. For example, the circuit 300 may illustrate an example of a block 170-*a* that includes an array of memory cells 305. Each of the memory cells 305 may be located at or otherwise accessible according to an intersection of a word line 310 (e.g., a WL) and a bit line 315 (e.g., a BL). The block 170-*a* may include a plurality of word line groups 340 (e.g., WGRs 340) that each include a set of word lines 310. In some instances, data may be written to one or more memory cells 305 of a word line group 340-*a* and a duration may occur before the data is read. Due to electrical properties of the memory cells 305 (e.g., due to leakage), the charge stored to the respective memory cells 305 may change (e.g., dissipate) over time. Accordingly, the controller 330 may determine the duration data has been stored to memory cells 305 of a WGR 340 and may adjust a voltage value of one or more reference voltages used to read the memory cells of the WGR 340. Adjusting the reference voltage values on a WGR basis may improve the circuit's 300 ability to accurately sense sets of memory cells 305 that have stored data for a relatively long duration.

In some examples, the circuit 300 may include a row decoder 325 and a column decoder 320. The word lines 310 and bit lines 315 may be coupled with the row decoder 325 and the column decoder 320, respectively, for controlling various biasing or activation of the respective access lines. In some examples, the row decoder 325 and the column decoder 320 may be components of a local controller 135, which may support access operations such as writing logic states to memory cells 305 or sensing logic states stored in memory cells 305, among other operations and signaling thereof. The row decoder 325 and the column decoder 320 may be coupled with a controller 330 that is configured to perform various techniques for BFEA schemes described herein. In various examples, the controller 330 may be included in a memory system controller 115, included in a local controller 135, or distributed between a memory system controller 115 and a local controller 135, among other configurations.

The memory cells 305 may be physically or electrically arranged within the block 170-*a*. In some examples, a subset of the word lines 310 may be associated with a respective WGR 340. For example, word lines WLa1 through WLai may be associated with WGR 340-*a*, word lines WLb1 through WLbi may be associated with WGR 340-*b*, and word lines WLn1 through WLni may be associated with WGR 340-*n*. While the circuit 300 illustrates three (3) sets of WGRs 340, it may be understood that the block 170-*a* may include any quantity of WGRs 340, and each WGR 340 may include any quantity of word lines 310. Thus, as used herein, a "block" may refer to a portion of a memory device that can be erased. A block may include one or more WGRs 340 that is associated with a set of word lines 310 and a plurality of memory cells 305.

In some examples, the circuit 300 may be coupled with a host system (e.g., a host system 105 described with reference to FIG. 1 or a host system 205 described with reference to FIG. 2) that is configured to send access commands to the controller 330. The access commands, which may be read commands or write commands, may be received by the controller 330 and may be decoded using the column decoder 320 and the row decoder 325. In some examples, the memory cells 305 of the block 170-*a* may be examples of multiple level cells that are each configured to store two or more bits of data. For example, a multi-level cell (MLC) may be capable of storing two (2) bits of data. In another example, a tri-level (or a triple-level (TLC)) cell may be capable of storing three (3) bits of data. As such, a TLC may store one of eight (8) potential voltage states that represent different logic states (e.g., 000, 001, 010, 011, 100, 101, 110, and 111). To distinguish between the different states, a TLC may use seven (7) reference voltages. Accordingly, during a write operation, the controller 330 may receive a command from the host system and may write data to one or more memory cells 305 of the block 170-*a*. In some instances, a write command may result in data being written to each memory cell 305 of a WGR 340 or of the block 170-*a*.

Upon writing data to one or more memory cells 305 of the block 170-*a*, the controller 330 may initiate a timing component 335. In some examples, the timing component 335 may be used to determine a duration that the data has been stored to the respective WGR 340 of the block 170-*a*. For example, the timing component 335 may determine (e.g., measure) the duration between when data is written to one or more memory cells of a WGR 340 and when the data is subsequently read. Because the data stored to any one memory cell 305 of the WGR 340 may be represented by a charge, and because the charge may change over time (e.g., decrease due to leakage), the timing component 335 may determine a duration that data has been stored to a WGR 340 which may be used by the controller 330 to adjust a value of one or more reference voltages used to determine the logic states written to the memory cells 310. That is, adjusting the values of the reference voltages may allow for the circuit 300 to compensate for leakage on a WGR 340 basis.

In some examples, the duration that data has been stored to the block 170-*a* may be used to make an initial adjustment (e.g., a first adjustment) of one or more reference voltage values. For example, blocks 170 may be categorized into various "bins" based on the age of the data stored to the respective bin. An initial adjustment of one or more reference voltage values may thus be made, for a block 170, based on which "bin" it is associated with. Accordingly, as used herein, a "bin" may refer to a logical grouping of a block 170 of data having a same or similar age, for which one or more reference voltage values are adjusted. For example, a first bin may represent data that has been stored for 1-2 hours and a second bin may represent data that been stored for 2-3 hours. Any range of times may be associated with a bin. Because data may be written to each memory cell of a block 170 during a single write operation, the data for an entire block 170 may be categorized into a single "bin" and thus one or more reference voltage values for the block 170 may be adjusted.

The circuit 300 may support any quantity of bins and each bin may be associated with a respective age range (e.g., a duration between when data is written to a block 170 and a current time or when a read command for the data is received). In some examples, the ranges for the bins may be preconfigured and may be stored (e.g., hardcoded) to a mapping managed by or accessible to the controller 330 or another component of the memory device 130. The ranges may be set based on one or more testing operations performed on the memory device 130 and may be set to optimize the accuracy at which data is read from the memory cells 305 after various durations.

Moreover, the reference voltage value adjustment performed by the controller 330 may refer to adjusting a voltage value of a "valley," which may be associated with a reference voltage. Different states stored by a memory cell may be characterized with distributions of probable voltage thresholds for that particular state. Each state may have a 'normal' gaussian distribution of voltage thresholds stored in the memory cell associated with each particular state. In such situations, reference voltages may ideally be located in the "valleys" between the distribution of voltage thresholds associated with two adjacent states of the memory cell. For example, to determine whether a memory cell stores a first logic state or a second logic state, a charge stored to the respective memory cell 305 may be compared with a first reference voltage that is associated with is positioned between a likely voltage level associated with the first logic state and a likely voltage level associated with the second logic state. Accordingly, as used herein, a "valley" may refer to a midpoint voltage value between two logic states, which may be adjusted during a BFEA operation as described herein. By way of example, a memory cell configured to store three bits of data may be associated with seven (7) valleys (e.g., seven midpoints between each of the eight logic stage values), and any one of the valleys (e.g., any one of the reference voltage values) may be adjusted by a respective voltage value.

Additionally or alternatively, the controller 330 may be configured to make an additional adjustment (e.g., a second adjustment) of one or more reference voltage values. For example, upon receiving a read command and determining a duration that data has been stored to a block 170, the controller 330 may adjust one or more reference voltage values for a respective WGR. That is, the controller 330 may further-adjust one or more reference voltage values for each WGR 340 (in addition to the block-level adjustment already determined), based on the duration the data has been stored to a respective memory cell 305 (or to respective memory cells 305). In some examples, the second adjustment may be a more granular adjustment than the first adjustment.

For example, memory cells 305 associated with the WGR 340-*a* may each be configured to store three bits of data and thus the controller 330 may adjust the reference voltage values for one or more of the word lines 310 WLa1 through WLai based on the age of the data stored to the block 170-*a*. In some examples, the controller 330 may adjust only a subset of the reference voltage values (e.g., the reference voltage values that are associated with valleys 5-7) for the WGR 340-*a*. Additionally or alternatively, the controller 330 may adjust the reference voltages for the word lines 310 of the WGR 340-*b* and the WGR 340-*n* by a same or by a different voltage value. By adjusting the reference voltage values on a WGR 340 basis, the circuit's 300 ability to accurately sense sets of memory cells 305 that have stored data for a relatively long duration may be improved.

FIG. 4A illustrates an example of a block diagram 400-*a* that supports reference voltage adjustment for word line groups in accordance with examples as disclosed herein. In some examples, the block diagram 400-*a* may depict a mapping that is stored to or accessible by a controller (e.g., a controller 330 as described with reference to FIG. 3) and is used by the controller to make a first adjustment of one or more reference voltage values for a memory device. In some examples, the mapping may include reference voltage value adjustments for different valleys 405 (e.g., reference voltages used to distinguish between different states stored by a memory cell) and bins 410 (e.g., ranges of time for storing data in the memory cells). While the mapping provides specific reference voltage adjustment values for different valleys 405 and bins 410, the values depicted in FIG. 4A are for exemplary purposes only. Thus, the mapping may provide a controller or other component of a memory device any set of reference voltage value adjustments, and the specific values stored to the mapping may be a matter of design. Regardless of the specific values stored to the mapping, adjusting the reference voltage values for a memory device based on the duration that data has been stored to one or more memory cells may improve the memory device's ability to accurately sense sets of memory cells that have stored data for a relatively long duration.

The mapping illustrated in FIG. 4A may include reference voltage value adjustments for respective valleys 405 and bins 410 associated with a block of a memory device (e.g., the mapping may be associated with block-based adjustments to reference voltages for all memory cells within that block). As described herein, the valleys 405 may represent a midpoint voltage value between two states of the memory cell. For example, valley 405-*a* may be positioned between logic state 000 and 001, valley 405-*b* may be positioned between logic state 001 and 010, valley 405-*c* may be positioned between logic state 010 and 011, valley 405-*d* may be positioned between logic state 011 and 100, valley 405-*e* may be positioned between logic state 100 and 101, valley 405-*f* may be positioned between logic state 101 and 110, and valley 405-*g* may be positioned between logic state 110 and 111.

Thus, although FIG. 4A illustrates seven (7) valleys, the mapping may include different quantities of valleys 405. For example, seven (7) valleys may represent a TLC (e.g., a memory cell configured to store one of eight (8) logic states, thus being associated with seven valleys), whereas three (3) valleys may represent a MLC, and one (1) valley may represent a single-level cell (SLC). Other configurations for other types of memory cells (e.g., SLC, MLC, TLC, QLC, etc.) may also be implemented. Thus, the quantities of valleys included in the mapping may depend on the type and configuration of memory cells of an associated memory device.

Moreover, the mapping may include a plurality of bins 410, which may refer to a logical arrangement (e.g., a logical groping) of a block of data that has a same or similar age. For example, the bin 410-*a* may be associated with a first age range (e.g., a first duration that data has been stored to one or more memory cells), the bin 410-*b* may be associated with a second age range, and so on. In some instances, each subsequent bin 410 may be associated with relatively older data and thus the associated memory cells may be less likely to retain a charge. That is, the bin 410-*g* may be associated with relatively higher reference voltage value adjustments than the bin 410-*a* because the associated memory cells may be less likely to have held an initial charge. Each bin 410 may be associated with a different age range, and the range of each bin 410 (as well quantity of bins 410 stored to the mapping) may be a matter of design.

In some examples, a controller of a memory device may make an initial reference voltage adjustment (e.g., a first adjustment) based on receiving a read command for data previously stored to a block of the memory device. For example, when the data was initially written to the block, the controller may have initiated a timer. Accordingly, when a read command for the data is received, the controller may determine an age of the data based on a value of the timer (or based on a duration from the initial timestamp). In some examples, the controller may initiate (e.g., manage) multiple timers associated with different blocks of the memory device and may determine which bin the respective data is associated with (e.g., which age range the value of the respective timer falls in). In such examples, adjustments to voltage values of reference voltages may be done on a block-by-block basis (meaning every reference voltage in a block may be adjusted).

In other examples, the controller or other component of the memory device may utilize a timestamp or other mechanism to determine a duration from when the data was initially written to the block and when a read command for the data is received. For example, the controller may log the time at which the read command is received and may log when the corresponding write command is received. The controller may then determine the age of the data based on the duration between the respective timestamps.

Upon determining which bin the data of a block is associated with, the controller may adjust the reference voltage values (e.g., the valleys 405) for the respective block. As an example, the controller may determine (e.g., using a timer) that data for a first block is associated with bin 410-*a*. As such, the controller may adjust the reference voltage values for valleys 1 through 7 (e.g., valleys 405-*a* through 405-*g*) by −20 mV, −20 mV, −40 mV, −40 mV, −50 mV, −60 mV, and −70 mV, respectively. As described herein, these reference voltage value adjustments are merely exemplary, and the controller may adjust the reference voltage values for valleys 1 through 7 by any value. After adjusting the reference voltage values for the block, the controller (or another component of the memory device) may read the memory cells of the first block using the adjusted reference voltage values, however in some examples the controller may make a second adjustment of the reference voltage values (e.g., as described with reference to FIG. 4B) before performing the read operation.

FIG. 4B illustrates an example of a block diagram 400-*b* that supports reference voltage adjustment for word line groups in accordance with examples as disclosed herein. In some examples, the block diagram 400-*b* may depict a mapping that is stored to or accessible by a controller (e.g., a controller 330 as described with reference to FIG. 3) and is used by the controller to make a second adjustment of one or more reference voltage values for a memory device. In some examples, the mapping may include reference voltage value adjustments for different WGRs 420, for a particular valley (e.g., a valley 405 as described with reference to FIG. 4A) based on a duration 415 that data has been stored to a respective WGR 420. In such examples, adjustments to voltage values of reference voltages may be done on a WGR-by-WGR basis (meaning every reference voltage in a WGR may be adjusted). In some cases, adjustments based on blocks and adjustments based on WGR considerations may be utilized together. In such cases, block level of adjustment may be determined and then WGR-level adjustments may be made to further refine the final voltage value of the reference voltages.

While the mapping provides specific reference voltage adjustment values for different WGRs 420, the values depicted in FIG. 4B are for exemplary purposes only. Moreover, FIG. 4B may illustrate a mapping used for adjusting reference voltage values for a particular valley, and thus an associated memory device may store different mappings for different valleys. Thus, the mapping may provide a controller or other component of a memory device any set of reference voltage value adjustments, and the specific values stored to the mapping (or the quantity of mappings) may be a matter of design choice. Regardless of the specific values stored to the mapping, adjusting the reference voltage values for WGRs of a memory device based on the duration that data has been stored to one or more memory cells may improve the memory device's ability to accurately sense sets of memory cells that have stored data for a relatively long duration.

The mapping illustrated in FIG. 4B may include reference voltage value adjustments for WGRs 420 based on the duration that data has been stored an associated block. For example, the mapping may illustrate WGR0 420-*a* through WGR7 420-*h*, which may be examples of the WGRs 340 as described with reference to FIG. 3. Each of the WGRs 420-*a* through 420-*h* may be associated with a same block and the mapping may illustrate reference voltage value adjustments for each WGR 420 for a specific valley. That is, based on the duration that data has been stored to one or more memory cells of a block, the reference voltage values for the WGRs 420 of the block may be further-adjusted for one or more valleys. In this manner, the mapping illustrated in FIG. 4B may be configured to be used in conjunction with the mapping illustrate in FIG. 4A.

The mapping illustrated in FIG. 4B further illustrates duration 1 415-*a* through duration 14 415-*n*. Each duration 415 may represent a time or a range of time (e.g., in hours) for which data has been stored to an associated block. Accordingly, for exemplary purposes only, if data has been stored to one or more memory cells for a duration associated with duration 8 415-*h*, the reference voltage values of the WGRs 420 of the block (e.g., for a particular valley) may be further-adjusted by 20 mV, 0 mV, 0 mV, 10 mV, 40 mV, 30 mV, 50 mV, and 80 mV.

Thus, although FIG. 4B illustrates eight (8) WGRs 420 and fourteen (14) durations 415, the mapping may include different quantities of WGRs 420 and durations 415. That is, a block may include any quantity of WGRs, and that quantity of WGRs may be included in the mapping. Moreover, the mapping may include any quantity of durations 415 (e.g., any quantity of age ranges), which may be a matter of design. In some instances, however, the mapping illustrated by FIG. 4B may include a greater quantity of age ranges than bins in the mapping illustrated by FIG. 4A. That is, the second adjustment performed to the reference voltage values for the various WGRs may be more granular than the first adjustment performed to the reference voltage values of the block.

In some instances, the reference voltage adjustments illustrated in FIG. 4B may be made relative to a single WGR 420. For example, the reference voltage adjustments may be made relative to WGR2 420-*c*, and thus the reference voltage values for WGR2 420-*c* may not be further-adjusted. The WGR 420 for which reference voltage adjustments are made relative to may be a matter of design choice based on the ability of the memory cells of a WGR 420 to retain respective charges over time. Moreover, the reference voltage adjustments illustrated in FIG. 4B may be made for a single valley 405 as described with reference to FIG. 4A. Accordingly, the mapping illustrated in FIG. 4B may illustrate the reference voltage adjustments for valley 7 405-*g*, although the associated memory device may include respective mappings for further-adjusting the reference voltage values for any valley 405. In some instances, the memory device may include at least three (3) mappings for further adjusting the reference voltage values, on a WGR 420 basis, for valley 5 405-*e*, valley 6 405-*f*, and valley 7 405-*g*. Each mapping may include different reference voltage value adjustments than the others.

In some examples, a controller of a memory device may make a second reference voltage adjustment after making the first adjustment as described with reference to FIG. 4A. For example, the controller may reference the timer (e.g., a value of the timer) used to make the first adjustment. Upon determining which duration 415 the data is associated with, the controller may further-adjust the reference voltage values for the WGRs 420 of the block. As an example, the controller may determine that data for a first block is associated with duration 415-*e* and may further-adjust the reference voltage values for WGR0 420-*a* through 420-*h*

(e.g., for valley 7) by −20 mV, 0 mV, 0 mV, −10 mV, −30 mV, −30 mV, −40 mV, and −70 mV. After adjusting the reference voltage values for the WGRs 420, the controller (or another component of the memory device) may read the memory cells of the first block using the adjusted reference voltage values.

In other examples, the mapping illustrated in FIG. 4B may not include voltage values (e.g., values to adjust the reference voltage values by), and may instead include an indicator to increase or decrease the bin 410 associated with the initial adjustment. For example, data associated with a block may be associated with Bin 4 410-*d* and the reference voltage values for each of the valleys 405 may be adjusted accordingly. However, when adjusting the reference voltage values for a second time (e.g., using the mapping illustrated by FIG. 4B), the adjustment may instead be Bin+1 or Bin−1, as examples. That is, if the data associated with the first block is associated with duration 415-*c*, the reference voltage values for WGR0 420-*a* through WGR7 420-*h* for valley 7 may be adjusted by −340 mV (e.g., Bin+1) or by −210 mV (e.g., Bin−1).

The mapping illustrated by FIG. 4B may support a Bin+/−N adjustment, where N is any integer that is less than the total quantity of bins included in the mapping illustrated by FIG. 4A. Whether the mapping illustrated by FIG. 4B includes voltage values or a Bin+/−N adjustment value, utilizing a BFEA scheme on a WGR basis may improve the associated system's ability to accurately sense sets of memory cells that have stored data for a relatively long duration.

Figure 5:
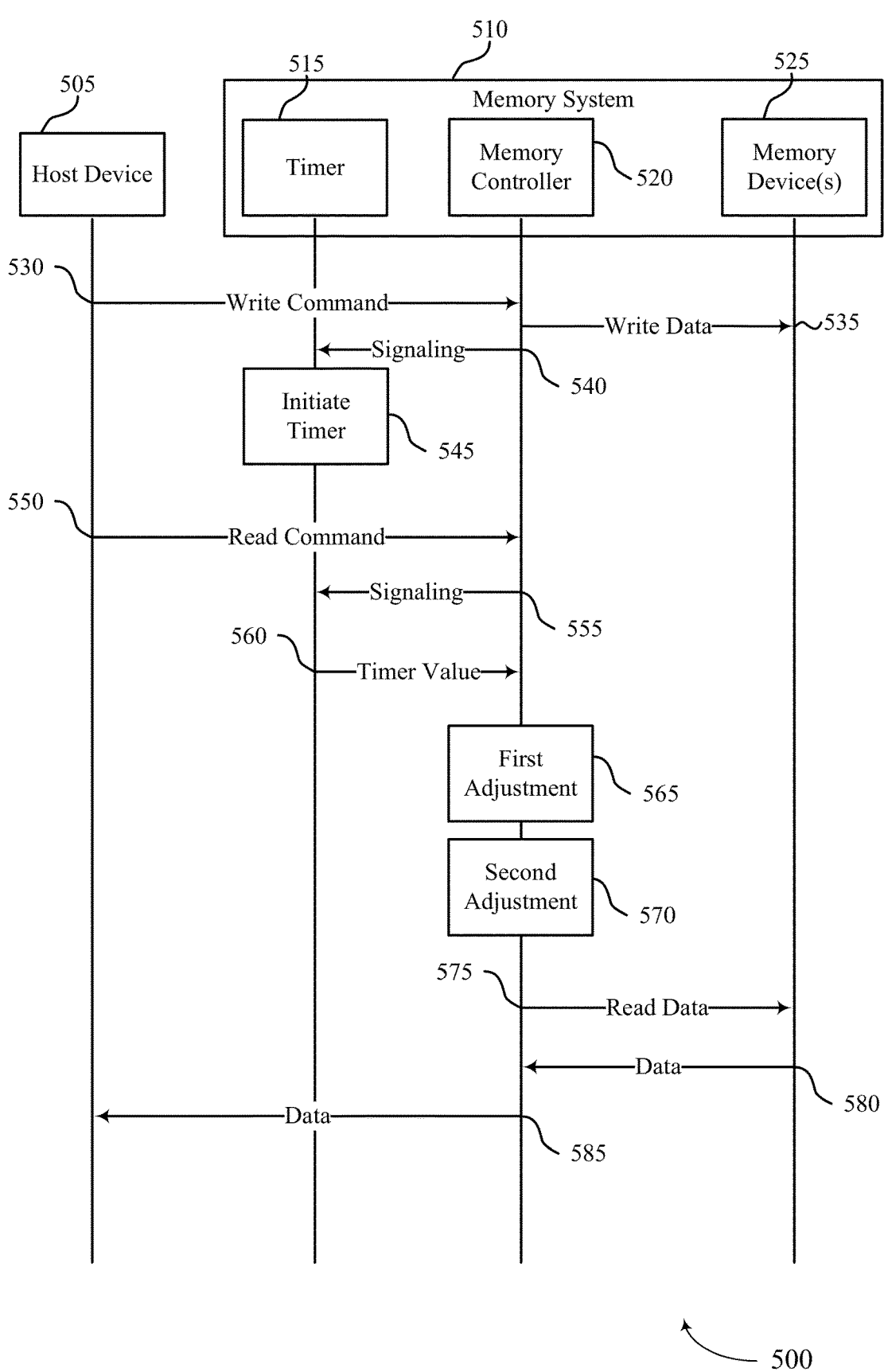
FIG. 5 illustrates an example of a process flow diagram that supports reference voltage adjustment for word line groups in accordance with examples as disclosed herein.

FIG. 5 illustrates an example of a process flow diagram 500 that supports reference voltage adjustment for word line groups in accordance with examples as disclosed herein. In some examples, the process flow diagram 500 may implement aspects described herein with reference to FIGS. 3, 4A, and 4B. Accordingly, the operations illustrated by the process flow diagram 500 may be performed at or by a host device 505 and a memory system 510. In some instances, the memory system 510 may include a timer 515, a memory controller 520, and one or more memory devices 525. The memory system 510 may support performing BFEA operations on both a block level and a WGR level as described with reference to FIGS. 4A and 4B. Performing a BFEA scheme on a WGR basis may improve the memory system's 510 ability to accurately sense sets of memory cells that have stored data for a relatively long duration.

At 530, the host device 505 may transmit a write command to the memory system 510. The write command may be received by the memory controller 520 and may include data to be written to one or more memory cells of a memory device 525. In some instances, the write command may include data to be written to a block of memory cells of the memory device 525. At 535, the memory controller 520 may write the data to an address of the memory device 525 included in the write command.

At 540, the memory controller 520 may transmit signaling to the timer 515. The signaling may include instructions to initiate, or may otherwise initiate the timer 515 based on the data being written to the memory device 525 (e.g., at 535). In some instances, the timer 515 may be included in the memory controller 520 and thus the memory controller 520 may not transmit signaling and may instead initiate the timer based on the data being written to the memory device 525. At 545, the timer 515 may be initiated. In some instances, the timer 515 may be initiated simultaneously with writing the data to the memory device 525 (e.g., at 535).

At 550, the host device 505 may transmit a read command to the memory system 510. The read command may be received by the memory controller 520 and may be for the data previously written to the memory device 525 (e.g., at 535).

At 555, the memory controller 520 may transmit signaling to the timer 515. The signaling may include a request to stop the timer 515 and to transmit a value of the timer 515 to the memory controller 520. The value of the timer may be or may represent the duration that the data was stored to the memory device 525 (e.g., the age of the data). In some instances, the timer 515 may be included in the memory controller 520 and thus the memory controller 520 may not transmit signaling and may instead stop the timer 515 and determine its value. At 560, the timer 515 may transmit a value (e.g., the duration) to the memory controller 520.

At 565, the memory controller 520 may initiate a first reference voltage adjustment based on the value of the timer (e.g., received at 560). The first reference voltage adjustment may be made using the mapping illustrated by and described with reference to FIG. 4A. That is, the adjustment may be made to the reference voltage values (e.g., the valleys 405 as described with reference to FIG. 4A) used by the block and may be based on which bin (e.g., which bin 410 as described with reference to FIG. 4A) the age of the data is associated with.

At 570, the memory controller 520 may initiate a second reference voltage adjustment, for WGRs of the block, based on the value of the timer (e.g., received at 560). The second reference voltage adjustment may be made using the mapping illustrated by and described with reference to FIG. 4B. That is, the adjustment may be made to the reference voltage values for the WGRs of the block for one or more valleys (e.g., the valleys 405 as described with reference to FIG. 4A). In some instances, the mapping referenced by the memory controller 520 may include actual voltage values whereas in other examples, the mapping may utilize a Bin+/−N method as described herein.

At 575, the memory controller 520 may read the data from the memory device 525 using the adjusted reference voltage values. At 580, the data may be communicated from the memory device 525 to the memory controller 520. At 585, the data may be transmitted from the memory controller 520 to the host device 505, thus satisfying the read command. Performing a BFEA scheme on a WGR basis, as described herein, may improve the memory system's 510 ability to accurately sense sets of memory cells that have stored data for a relatively long duration.

Figure 6:
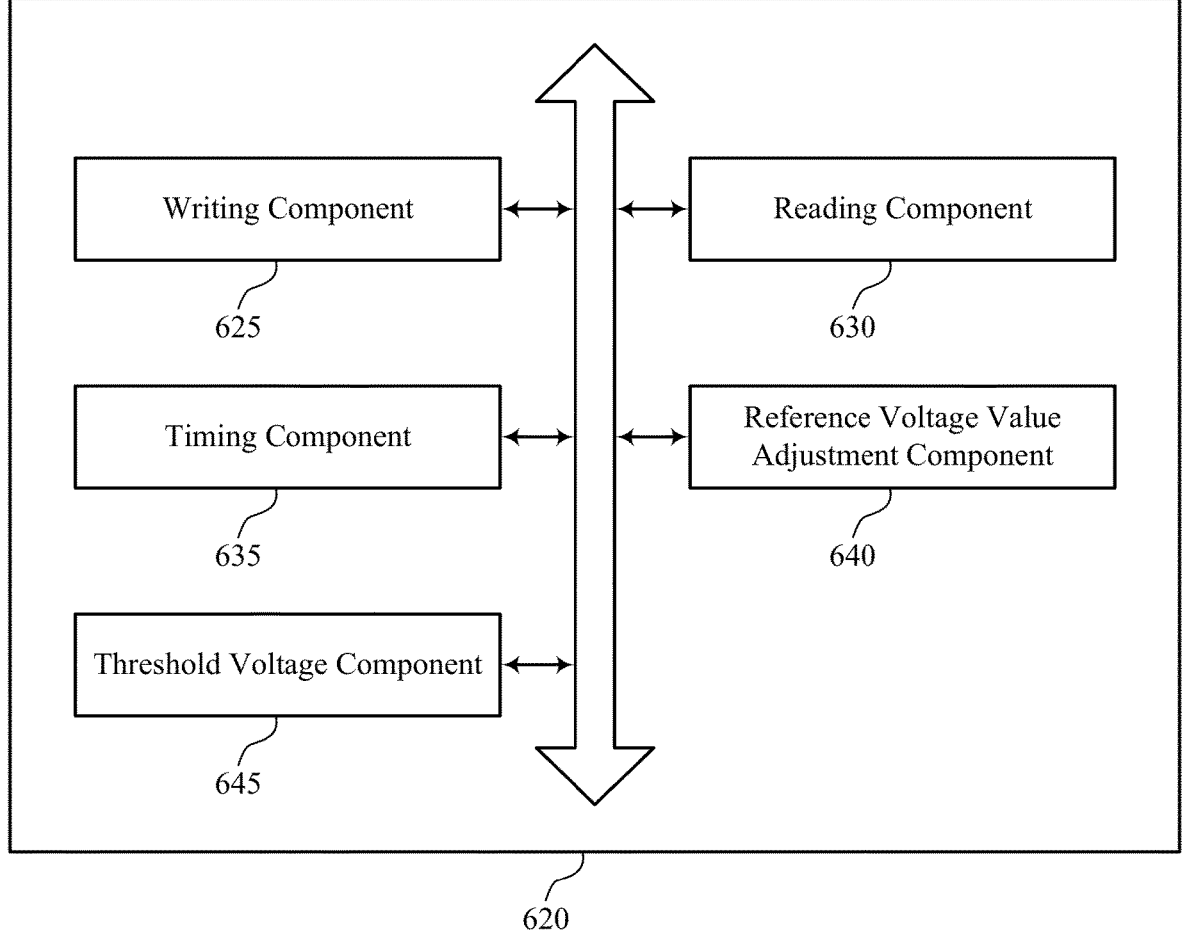
FIG. 6 shows a block diagram of a memory device that supports reference voltage adjustment for word line groups in accordance with examples as disclosed herein.

FIG. 6 shows a block diagram 600 of a memory device 620 that supports reference voltage adjustment for word line groups in accordance with examples as disclosed herein. The memory device 620 may be an example of aspects of a memory device as described with reference to FIGS. 1 through 5. The memory device 620, or various components thereof, may be an example of means for performing various aspects of reference voltage adjustment for WGRs as described herein. For example, the memory device 620 may include a writing component 625, a reading component 630, a timing component 635, a reference voltage value adjustment component 640, a threshold voltage component 645, or any combination thereof. Each of these components may communicate, directly or indirectly, with one another (e.g., via one or more buses).

The writing component 625 may be configured as or otherwise support a means for writing, at a first time, data to at least one memory cell of a first plurality of memory cells, where the first plurality of memory cells is coupled with a first word line that is associated with a block of memory cells.

The reading component 630 may be configured as or otherwise support a means for initiating, at a second time after the first time, a read operation to read the data based at least in part on writing the data. In some examples, the reading component 630 may be configured as or otherwise support a means for reading the data from the at least one memory cell associated with the first word line based at least in part on adjusting the first plurality of reference voltage values and the second plurality of reference voltage values. In some examples, the reading component 630 may be configured as or otherwise support a means for receiving a read command to read the data, where initiating the read operation is based at least in part on receiving the read command.

The timing component 635 may be configured as or otherwise support a means for determining a duration between the first time and the second time based at least in part on initiating the read operation. In some examples, the timing component 635 may be configured as or otherwise support a means for initiating a timer based at least in part on writing the data to the at least one memory cell of the first plurality of memory cells at the first time, where the duration between the first time and the second time is based at least in part on initiating the timer.

The reference voltage value adjustment component 640 may be configured as or otherwise support a means for adjusting a first plurality of reference voltage values of a first plurality of reference voltages associated with the first word line associated with the block that stores the data and a second plurality of reference voltage values of a second plurality of reference voltages associated with a second word line associated with the block that stores the data based at least in part on determining the duration between the first time and the second time, where the first plurality of reference voltage values are different than the second plurality of reference voltage values.

In some examples, the reference voltage value adjustment component 640 may be configured as or otherwise support a means for determining a first set of adjustments of a third plurality of reference voltage values based at least in part on the duration between the first time and the second time, the first set of adjustments used by each memory cell in the block of memory cells, where the third plurality of reference voltage values includes the first plurality of reference voltage values and the second plurality of reference voltage values, and where adjusting the first plurality of reference voltage values and the second plurality of reference voltage values is based at least in part on the first set of adjustments.

In some examples, the reference voltage value adjustment component 640 may be configured as or otherwise support a means for determining a second set of adjustments of the first plurality of reference voltage values based at least in part on determining the first set of adjustments, where the second set of adjustments includes adjusting a respective plurality of reference voltage values for each word line associated with the block of memory cells, and where adjusting the first plurality of reference voltage values is based at least in part on the second set of adjustments.

In some examples, to support determining the second set of adjustments of the first plurality of reference voltage values, the reference voltage value adjustment component 640 may be configured as or otherwise support a means for adjusting the first plurality of reference voltage values associated with the first plurality of memory cells. In some examples, to support determining the second set of adjustments of the first plurality of reference voltage values, the reference voltage value adjustment component 640 may be configured as or otherwise support a means for refraining from adjusting the second plurality of reference voltage values associated with a second plurality of memory cells.

In some examples, the reference voltage value adjustment component 640 may be configured as or otherwise support a means for determining a second set of adjustments of the third plurality of reference voltage values associated with the block of memory cells based at least in part on determining the second set of adjustments of the third plurality of reference voltage values, where adjusting the first plurality of reference voltages associated with the first plurality of memory cells is based at least in part on determining the second set of adjustments of the third plurality of reference voltage values.

In some examples, the reference voltage value adjustment component 640 may be configured as or otherwise support a means for identifying an adjustment index associated with the first word line associated with the block based at least in part on determining the duration between the first time and the second time, where the adjustment index indicates a third set of adjustments of the third plurality of reference voltage values, and where adjusting the first plurality of reference voltage values is based at least in part on the third set of adjustments.

In some examples, to support adjusting the first plurality of reference voltages associated with the first plurality of memory cells, the reference voltage value adjustment component 640 may be configured as or otherwise support a means for adjusting a value of the first reference voltage by a first value. In some examples, to support adjusting the first plurality of reference voltages associated with the first plurality of memory cells, the reference voltage value adjustment component 640 may be configured as or otherwise support a means for adjusting a value of the second reference voltage by a second value that is different than the first value.

In some examples, the threshold voltage component 645 may be configured as or otherwise support a means for determining that an adjustment of the first plurality of reference voltage values exceeds a threshold voltage value adjustment based at least in part on determining the duration between the first time and the second time.

In some examples, a first reference voltage of the first plurality of reference voltages distinguishes between a first state and a second state capable of being stored by a memory cell and a second reference voltage of the first plurality of reference voltages distinguishes between the second state and a third state capable of being stored by the memory cell.

In some examples, the memory cell is configured to store three bits of information using eight states. In some examples, at least the first plurality of memory cells are not accessed during the duration between the first time and the second time. In some examples, a second plurality of memory cells coupled with the second word line are associated with the block of memory cells.

FIG. 7 shows a flowchart illustrating a method 700 that supports reference voltage adjustment for word line groups in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include writing, at a first time, data to at least one memory cell of a first plurality of memory cells, where the first plurality of memory cells is coupled with a first word line that is associated with a block of memory cells. The operations of 705 may be performed in accordance with examples as disclosed herein. In some examples, aspects of the operations of 705 may be performed by a writing component 625 as described with reference to FIG. 6.

At 710, the method may include initiating, at a second time after the first time, a read operation to read the data based at least in part on writing the data. The operations of 710 may be performed in accordance with examples as disclosed herein. In some examples, aspects of the operations of 710 may be performed by a reading component 630 as described with reference to FIG. 6.

At 715, the method may include determining a duration between the first time and the second time based at least in part on initiating the read operation. The operations of 715 may be performed in accordance with examples as disclosed herein. In some examples, aspects of the operations of 715 may be performed by a timing component 635 as described with reference to FIG. 6.

At 720, the method may include adjusting a first plurality of reference voltage values of a first plurality of reference voltages associated with the first word line associated with the block that stores the data and a second plurality of reference voltage values of a second plurality of reference voltages associated with a second word line associated with the block that stores the data based at least in part on determining the duration between the first time and the second time, where the first plurality of reference voltage values are different than the second plurality of reference voltage values. The operations of 720 may be performed in accordance with examples as disclosed herein. In some examples, aspects of the operations of 720 may be performed by a reference voltage value adjustment component 640 as described with reference to FIG. 6.

At 725, the method may include reading the data from the at least one memory cell associated with the first word line based at least in part on adjusting the first plurality of reference voltage values and the second plurality of reference voltage values. The operations of 725 may be performed in accordance with examples as disclosed herein. In some examples, aspects of the operations of 725 may be performed by a reading component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for writing, at a first time, data to at least one memory cell of a first plurality of memory cells, where the first plurality of memory cells is coupled with a first word line that is associated with a block of memory cells; initiating, at a second time after the first time, a read operation to read the data based at least in part on writing the data; determining a duration between the first time and the second time based at least in part on initiating the read operation; adjusting a first plurality of reference voltage values of a first plurality of reference voltages associated with the first word line associated with the block that stores the data and a second plurality of reference voltage values of a second plurality of reference voltages associated with a second word line associated with the block that stores the data based at least in part on determining the duration between the first time and the second time, where the first plurality of reference voltage values are different than the second plurality of reference voltage values; and reading the data from the at least one memory cell associated with the first word line based at least in part on adjusting the first plurality of reference voltage values and the second plurality of reference voltage values.

Aspect 2: The method, apparatus, or non-transitory computer-readable medium of aspect 1, further including operations, features, circuitry, logic, means, or instructions, or any combination thereof for determining a first set of adjustments of a third plurality of reference voltage values based at least in part on the duration between the first time and the second time, the first set of adjustments used by each memory cell in the block of memory cells, where the third plurality of reference voltage values includes the first plurality of reference voltage values and the second plurality of reference voltage values, and where adjusting the first plurality of reference voltage values and the second plurality of reference voltage values is based at least in part on the first set of adjustments.

Aspect 3: The method, apparatus, or non-transitory computer-readable medium of aspect 2, further including operations, features, circuitry, logic, means, or instructions, or any combination thereof for determining a second set of adjustments of the first plurality of reference voltage values based at least in part on determining the first set of adjustments, where the second set of adjustments includes adjusting a respective plurality of reference voltage values for each word line associated with the block of memory cells, and where adjusting the first plurality of reference voltage values is based at least in part on the second set of adjustments.

Aspect 4: The method, apparatus, or non-transitory computer-readable medium of aspect 3 where determining the second set of adjustments of the first plurality of reference voltage values includes operations, features, circuitry, logic, means, or instructions, or any combination thereof for adjusting the first plurality of reference voltage values associated with the first plurality of memory cells and refraining from adjusting the second plurality of reference voltage values associated with a second plurality of memory cells.

Aspect 5: The method, apparatus, or non-transitory computer-readable medium of any of aspects 2 through 4, further including operations, features, circuitry, logic, means, or instructions, or any combination thereof for determining that an adjustment of the first plurality of reference voltage values exceeds a threshold voltage value adjustment based at least in part on determining the duration between the first time and the second time and determining a second set of adjustments of the third plurality of reference voltage values associated with the block of memory cells based at least in part on determining the second set of adjustments of the third plurality of reference voltage values, where adjusting the first plurality of reference voltages associated with the first plurality of memory cells is based at least in part on determining the second set of adjustments of the third plurality of reference voltage values.

Aspect 6: The method, apparatus, or non-transitory computer-readable medium of any of aspects 2 through 5, further including operations, features, circuitry, logic, means, or instructions, or any combination thereof for identifying an adjustment index associated with the first word line associated with the block based at least in part on determining the duration between the first time and the second time, where the adjustment index indicates a third set of adjustments of the third plurality of reference voltage values, and where adjusting the first plurality of reference voltage values is based at least in part on the third set of adjustments.

Aspect 7: The method, apparatus, or non-transitory computer-readable medium of any of aspects 1 through 6, further including operations, features, circuitry, logic, means, or instructions, or any combination thereof for initiating a timer based at least in part on writing the data to the at least one memory cell of the first plurality of memory cells at the first time, where the duration between the first time and the second time is based at least in part on initiating the timer.

Aspect 8: The method, apparatus, or non-transitory computer-readable medium of any of aspects 1 through 7 where a first reference voltage of the first plurality of reference voltages distinguishes between a first state and a second state capable of being stored by a memory cell and a second reference voltage of the first plurality of reference voltages distinguishes between the second state and a third state capable of being stored by the memory cell.

Aspect 9: The method, apparatus, or non-transitory computer-readable medium of aspect 8 where the memory cell is configured to store three bits of information using eight states.

Aspect 10: The method, apparatus, or non-transitory computer-readable medium of any of aspects 8 through 9 where adjusting the first plurality of reference voltages associated with the first plurality of memory cells includes operations, features, circuitry, logic, means, or instructions, or any combination thereof for adjusting a value of the first reference voltage by a first value and adjusting a value of the second reference voltage by a second value that is different than the first value.

Aspect 11: The method, apparatus, or non-transitory computer-readable medium of any of aspects 1 through 10 where at least the first plurality of memory cells are not accessed during the duration between the first time and the second time.

Aspect 12: The method, apparatus, or non-transitory computer-readable medium of any of aspects 1 through 11 where a second plurality of memory cells coupled with the second word line are associated with the block of memory cells.

Aspect 13: The method, apparatus, or non-transitory computer-readable medium of any of aspects 1 through 12, further including operations, features, circuitry, logic, means, or instructions, or any combination thereof for receiving a read command to read the data, where initiating the read operation is based at least in part on receiving the read command.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

Additionally, the terms "directly in response to" or "in direct response to" may refer to one condition or action occurring as a direct result of a previous condition or action. In some examples, a first condition or action may be performed, and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is prop- erly termed a computer-readable medium. For example, if the software is transmitted from a website, server, or other remote source using a coaxial cable, fiber optic cable, twisted pair, digital subscriber line (DSL), or wireless tech- nologies such as infrared, radio, and microwave, then the coaxial cable, fiber optic cable, twisted pair, DSL, or wire- less technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:

one or more memory devices; and processing circuitry coupled with the one or more memory devices and configured to cause the memory system to:

determine a duration between a write operation for data associated with a first word line of a block of memory cells of the one or more memory devices and a read operation;

adjust a first plurality of reference voltage values associated with the first word line and a second plurality of reference voltage values associated with a second word line associated with the block of memory cells based at least in part on determining the duration between the write operation and the read operation; and read the data from the block of memory cells associated with the first word line based at least in part on adjusting the first plurality of reference voltage val- ues.

2. The memory system of claim 1, wherein the processing circuitry is further configured to cause the memory system to:

determine a first set of adjustments of a third plurality of reference voltage values based at least in part on the duration between the write operation and the read operation, wherein the third plurality of reference volt- age values comprises the first plurality of reference voltage values and the second plurality of reference voltage values.

3. The memory system of claim 2, wherein the processing circuitry is further configured to cause the memory system to:

determine a second set of adjustments of the first plurality of reference voltage values based at least in part on determining the first set of adjustments, wherein the second set of adjustments comprises adjusting a respec- tive plurality of reference voltage values for each word line associated with the block of memory cells.

4. The memory system of claim 3, wherein to determine the second set of adjustments of the first plurality of refer- ence voltage values, the processing circuitry is configured to cause the memory system to:

adjust the first plurality of reference voltage values asso- ciated with the first word line; and refrain from adjusting the second plurality of reference voltage values associated with a second plurality of memory cells.

5. The memory system of claim 2, wherein the processing circuitry is further configured to cause the memory system to:

determine that an adjustment of the first plurality of reference voltage values satisfies a threshold voltage value adjustment based at least in part on determining the duration between the write operation and the read operation; and determine a second set of adjustments of the third plu- rality of reference voltage values associated with the block of memory cells based at least in part on deter- mining the second set of adjustments of the third plurality of reference voltage values.

6. The memory system of claim 2, wherein the processing circuitry is further configured to cause the memory system to:

identify an adjustment index associated with the first word line associated with the block based at least in part on determining the duration between the write operation and the read operation, wherein the adjustment index indicates a third set of adjustments of the third plurality of reference voltage values.

7. The memory system of claim 1, wherein the processing circuitry is further configured to cause the memory system to:

initiate a timer based at least in part on writing the data to the first word line, wherein determining the duration between the write operation and the read operation is based at least in part on initiating the timer.

8. The memory system of claim 1, wherein a first refer- ence voltage value of the first plurality of reference voltage values distinguishes between a first state and a second state capable of being stored by a memory cell, and a second reference voltage value of the first plurality of reference voltage values distinguishes between the second state and a third state capable of being stored by the memory cell.

9. The memory system of claim 8, wherein:

the memory cell is configured to store three bits of information using eight states.

10. The memory system of claim 1, wherein adjusting the first plurality of reference voltage values associated with the first word line is configured to cause the memory system to:

adjust a first reference voltage value of the first plurality of reference voltage values by a first value; and adjust a second reference voltage value of the second plurality of reference voltage values by a second value that is different than the first value.

11. The memory system of claim 1, wherein at least the first word line is not accessed during the duration between the write operation and the read operation.

12. The memory system of claim 1, wherein a second plurality of memory cells coupled with the second word line are associated with the block of memory cells.

13. The memory system of claim 1, wherein the process- ing circuitry is further configured to cause the memory system to:

receive a read command to read the data, wherein initiating the read operation is based at least in part on receiving the read command.

14. A method, comprising:

determining a duration between a write operation for data associated with a first word line of a block of memory cells of one or more memory devices and a read operation;

adjusting a first plurality of reference voltage values associated with the first word line and a second plurality of reference voltage values associated with a second word line associated with the block of memory cells based at least in part on determining the duration between the write operation and the read operation; and reading the data from the block of memory cells associated with the first word line based at least in part on adjusting the first plurality of reference voltage values.

15. The method of claim 14, further comprising:

determining a first set of adjustments of a third plurality of reference voltage values based at least in part on the duration between the write operation and the read operation, wherein the third plurality of reference voltage values comprises the first plurality of reference voltage values and the second plurality of reference voltage values.

16. The method of claim 15, further comprising:

determining a second set of adjustments of the first plurality of reference voltage values based at least in part on determining the first set of adjustments, wherein the second set of adjustments comprises adjusting a respective plurality of reference voltage values for each word line associated with the block of memory cells.

17. The method of claim 16, wherein determining the second set of adjustments of the first plurality of reference voltage values comprises:

adjusting the first plurality of reference voltage values associated with the first word line; and refraining from adjusting the second plurality of reference voltage values associated with a second plurality of memory cells.

18. The method of claim 15, further comprising:

determining that an adjustment of the first plurality of reference voltage values satisfies a threshold voltage value adjustment based at least in part on determining the duration between the write operation and the read operation; and determining a second set of adjustments of the third plurality of reference voltage values associated with the block of memory cells based at least in part on determining the second set of adjustments of the third plurality of reference voltage values.

19. A memory system, comprising:

one or more memory devices; and processing circuitry coupled with the one or more memory devices and configured to cause the memory system to:

determine a bin associated with a block of memory cells based at least in part on a first duration occurring after a write operation for data associated with the block of memory cells;

adjust a first plurality of reference voltage values associated with the block of memory cells based at least in part on determining the bin associated with the block of memory cells, the first plurality of reference voltage values associated with differentiating between logic states stored by the one or more memory devices;

adjust a second plurality of reference voltage values associated with one or more word lines of the block of memory cells based at least in part on a second duration occurring after the write operation; and read the data from the block of memory cells based at least in part on adjusting the first plurality of reference voltage values.

20. The memory system of claim 19, wherein the processing circuitry is further configured to cause the memory system to:

initiate a timer based at least in part on writing the data to the block of memory cells, wherein the first duration and the second duration are each determined based at least in part on a respective value of the timer after the write operation.

* * * * *